(12) United States Patent
Asam

(10) Patent No.: US 6,545,517 B2
(45) Date of Patent: Apr. 8, 2003

(54) FREQUENCY SPLITTER CIRCUIT

(75) Inventor: Michael Asam, Wollomoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/948,260

(22) Filed: Sep. 6, 2001

(65) Prior Publication Data

US 2002/0067191 A1 Jun. 6, 2002

(30) Foreign Application Priority Data

Sep. 6, 2000 (DE) .......................... 100 43 953

(51) Int. Cl.[7] .............................................. H03B 19/00
(52) U.S. Cl. ...................................... 327/115; 327/117
(58) Field of Search ................................ 327/115, 113, 327/117, 118

(56) References Cited

U.S. PATENT DOCUMENTS 6,140,845 A  * 10/2000  Benachour ................... 327/57
6,285,262 B1 *  9/2001  Kuriyama .................... 327/156

FOREIGN PATENT DOCUMENTS

| JP | 03 022 622 A | 1/1991 |
|----|--------------|--------|
| JP | 04 274 616 A | 9/1992 |

OTHER PUBLICATIONS

Tietze, Schenk: "Halbleiter–Schaltungstechnik" (Semiconductor–Circuit Engineering), vol. 10, pp. 235–240.

* cited by examiner

*Primary Examiner*—Dinh T. Le
(74) *Attorney, Agent, or Firm*—Laurence A. Greenberg; Werner H. Stemer; Gregory L. Mayback

(57) ABSTRACT

A frequency splitter circuit includes only two differential amplifiers. A clock input signal is supplied to clock signal inputs for activating the amplifiers. A respective signal of half the frequency of the clock input signal is derivable at main and auxiliary outputs. The differential amplifiers are cross-coupled. The frequency splitter circuit is operable with low supply voltage and provides high signal amplitudes at the output, high edge steepness, and low phase noise. The frequency splitter circuit can be utilized in high-frequency receivers, for example.

7 Claims, 4 Drawing Sheets

FREQUENCY SPLITTER CIRCUIT

BACKGROUND OF THE INVENTION

Field of the Invention

The invention relates to a frequency splitter circuit. Frequency splitters are digital circuits in which the input frequencies are whole-number multiples of the output frequencies. The simplest frequency splitter consists of a bi-stable binary scaler, which splits the input frequency in a ratio of 2:1.

Frequency splitters are typically realized with master-slave flip-flops. An example of this type of frequency splitter circuit is described in *Halbleiterschaltungstechnik* (Tietze, Schenk, $10^{th}$ ed.: 235–40). However, at least three transistor levels are arranged on top of one another between two supply potentials in these known frequency splitter circuits, so that relatively large supply voltages are needed to supply these known frequency splitter circuits, and only relatively small signal amplitudes can be achieved therewith.

But the high growth rates for mobile electrically operated devices, including in the field of communications or entertainment electronics, demand circuits which are suitable for ever smaller supply voltages and which exhibit a small current consumption.

SUMMARY OF THE INVENTION

It is accordingly an object of the invention to provide a frequency splitter circuit which overcomes the above-mentioned disadvantageous of the prior art apparatus of this general type. In particular, it is an object of the invention to provide such a frequency splitter circuit that is suitable for low supply voltages and with which large signal amplitudes can be achieved.

With the foregoing and other objects in view there is provided, in accordance with the invention, a frequency splitter circuit, that includes: a clock input for receiving a clock input signal having a frequency; a main output providing a clock output signal having a frequency that is split relative to the frequency of the clock input signal; an auxiliary output providing a clock output signal having a frequency that is split relative to the frequency of the clock input signal; a first differential amplifier having an input coupled to the auxiliary output and having an output coupled to the main output; and a second differential amplifier having an input coupled to the main output and having an output coupled to the auxiliary output. The first differential amplifier and the second differential amplifier are coupled with the clock input.

The described frequency splitter circuit includes two differential amplifiers, one of which is active, depending on the clock input signal. The clock output signals, which are derivable at the main and auxiliary outputs, respectively, are phase-shifted 90° relative to each other. Since the described frequency splitter circuit requires only two differential amplifiers, it can be realized with a small current consumption. In addition, the differential amplifiers, and thus the frequency splitter circuit, are suitable for operation with small supply voltages. At the same time, the differential amplifiers enable the output clock signals to have large signal amplitudes.

In accordance with an added feature of the invention, the first differential amplifier includes means for providing an inverted signal, and the second differential amplifier includes means for providing a non-inverted signal. The first differential amplifier provides the signal of the auxiliary output, which is available on the input side (input of the first differential amplifier), in inverted form on the output side (output of the first differential amplifier) at the main output. The second differential amplifier provides the signal of the main output, which is available on the input side (input of the second differential amplifier), in non-inverted form on the output side (output of the second differential amplifier) at the auxiliary output. The first and second differential amplifiers are alternately active in dependence upon the clock input signal. The means for providing inverted or non-inverted signals can be constructed rather simply, for instance by poling terminal pairs, if the clock output signals are present as differential signals, and main and auxiliary outputs are realized with corresponding terminal pairs.

In accordance with an additional feature of the invention, the differential amplifiers include means for holding a signal on the input side. In addition to providing an inverted or non-inverted signal, the differential amplifiers can include means for holding the respective signal on the input side. The first differential amplifier holds the clock output signal at the auxiliary output, and the second differential amplifier holds the clock output signal at the main output. When the differential amplifiers have inverting characteristics without additional wiring, the holding means can be realized rather simply if the clock output signals are present as differential signals.

In accordance with another feature of the invention, there is provided an embodiment in which the first and second differential amplifiers are each connected to a current source, which can be switched with the aid of the clock input signal. The current sources can alternately activate first and second differential amplifiers in dependence upon the clock input signal. The frequency splitter circuit, which includes switchable current sources has a particularly simple circuit structure. The current sources can be connected to the differential amplifiers on the reference potential side, giving the circuit characteristics substantial independence from oscillations of the supply voltage supplying the frequency splitter.

In accordance with a further feature of the invention, the first and second differential amplifiers are each connected to an emitter follower, which is switchable with the aid of the clock input signal. This way, the differential amplifiers can be cut off particularly rapidly, and large edge steepnesses of the clock output signals are possible.

In addition, this embodiment is suitable for particularly small supply voltages and large signal amplitudes at the output.

In accordance with a further added feature of the invention, an emitter follower is coupled to each of the differential amplifiers on the input side for coupling with the main and auxiliary outputs. This way, the amplitudes of the clock output signal can be increased still further. This also produces still greater edge steepness, which reduces the phase noise of the frequency splitter circuit. The emitter followers thus act as impedance converters.

In accordance with a further additional feature of the invention, the differential amplifiers each include four emitter-coupled npn transistors, whose emitter terminals are coupled with the input. Of the four emitter-coupled transistors, two can be provided for providing the inverted or non-inverted signal to the differential amplifiers on the output side, and two can be provided for holding a signal which is pending at the differential amplifier on the input side.

In accordance with a concomitant feature of the invention, the clock input signal can be supplied to the emitter terminals of the transistors of the first differential amplifier in non-inverted form, and to the emitter terminals of the transistors of the second differential amplifier in inverted form.

Other features which are considered as characteristic for the invention are set forth in the appended claims.

Although the invention is illustrated and described herein as embodied in frequency splitter circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
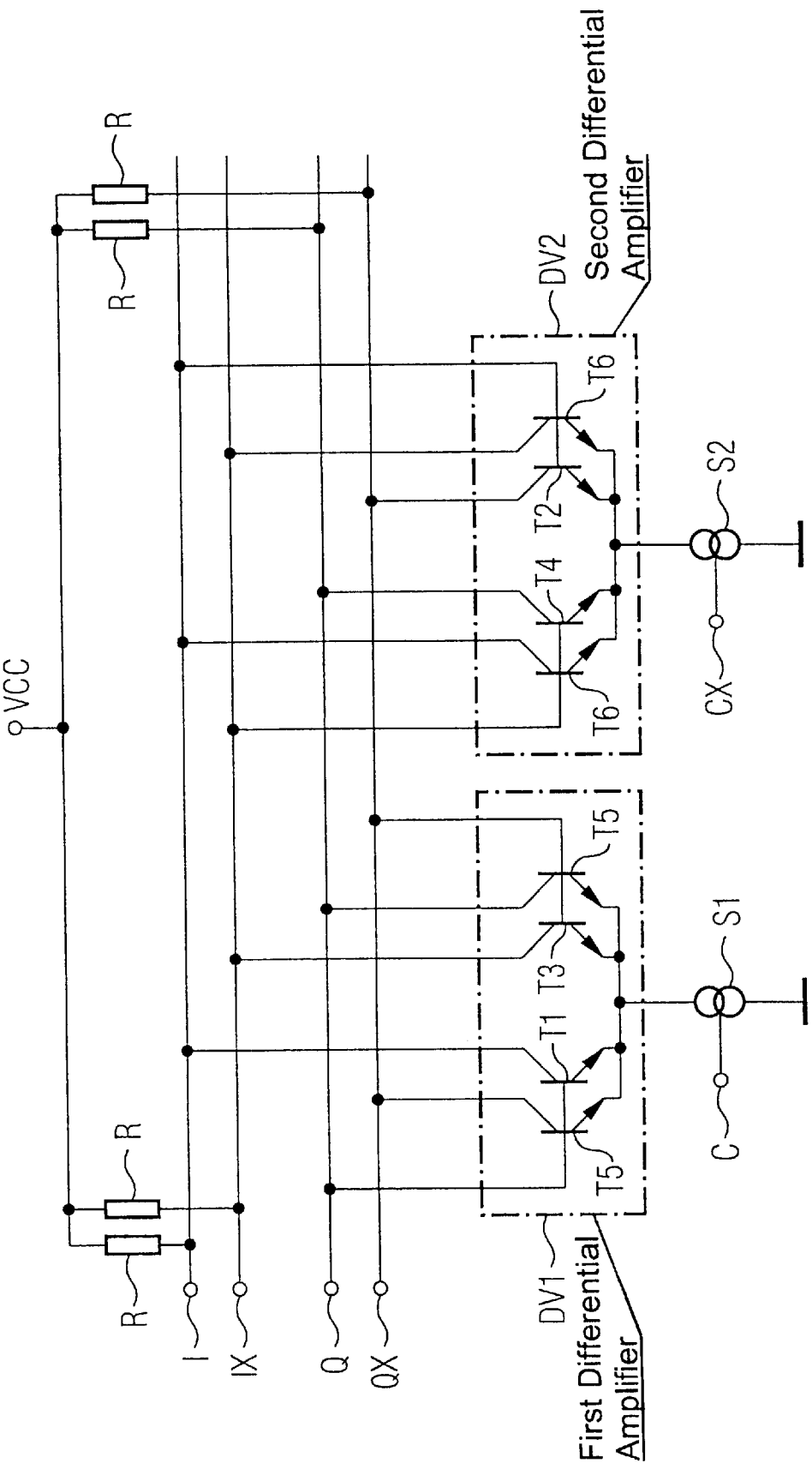
FIG. 1 a circuit diagram of a first exemplary embodiment of a frequency splitter circuit.

Referring now to the figures of the drawing in detail and first, particularly, to FIG. 1 thereof, there is shown a frequency splitter circuit including an input C, CX, which is connected to current sources S1, S2 for the actuation thereof. The switchable current sources S1, S2 are supplied with a clock input signal, on one hand in non-inverted form, and on the other hand in inverted form. The switchable current sources S1, S2 are respectively connected to a common emitter line of the first differential amplifier DV1 and the second differential amplifier DV2, respectively. Thus, the first differential amplifier DV1 is actuated by the non-inverted clock input signal at input C, and the second differential amplifier DV2 is actuated by the inverted clock input signal at input CX. Accordingly, first and second differential amplifiers DV1, DV2 are alternately active, depending upon the clock input signal.

The first differential amplifier DV1 has an input side that is connected to the auxiliary output Q, QX and has an output side that is connected to the main output I, IX by a first transistor pair T1, T3. When the first differential amplifier DV1 is active, the inverse signal of the signal at the auxiliary output Q, QX is formed at the main output I, IX. The first differential amplifier DV1 includes a second transistor pair T5 that forms a self-holding mechanism for the signal at the auxiliary output Q, QX, when the first differential amplifier DV1 is active. The first and second differential amplifiers DV1, DV2 are supplied with a voltage using a supply terminal VCC and resistors R, by way of which the supply terminal VCC is connected to the main output I, IX and the auxiliary output Q, QX. The main and the auxiliary outputs I, IX, Q, QX are constructed such that each includes a terminal pair for providing differential signals. In connecting the differential amplifiers DV1, DV2 to the outputs I, IX, Q, QX, the inverting characteristics, which usually attend to differential amplifiers must be taken into account.

The frequency splitter circuit includes only two differential amplifiers DV1, DV2 and is operable with a small supply voltage, since only a few transistor levels are provided. At each of the outputs Q, QX, I, IX, a signal can be tapped that has half the frequency of the clock signal that is applied to the clock signal input C, CX and that has large signal amplitudes. The described frequency splitter circuit has a low current consumption. Since a phase shift of 90 degrees exists between the clock output signals, the frequency splitter circuit can, for instance, be integrated in receiver circuits requiring a carrier signal consisting of in phase and quadrature components.

Figure 2:
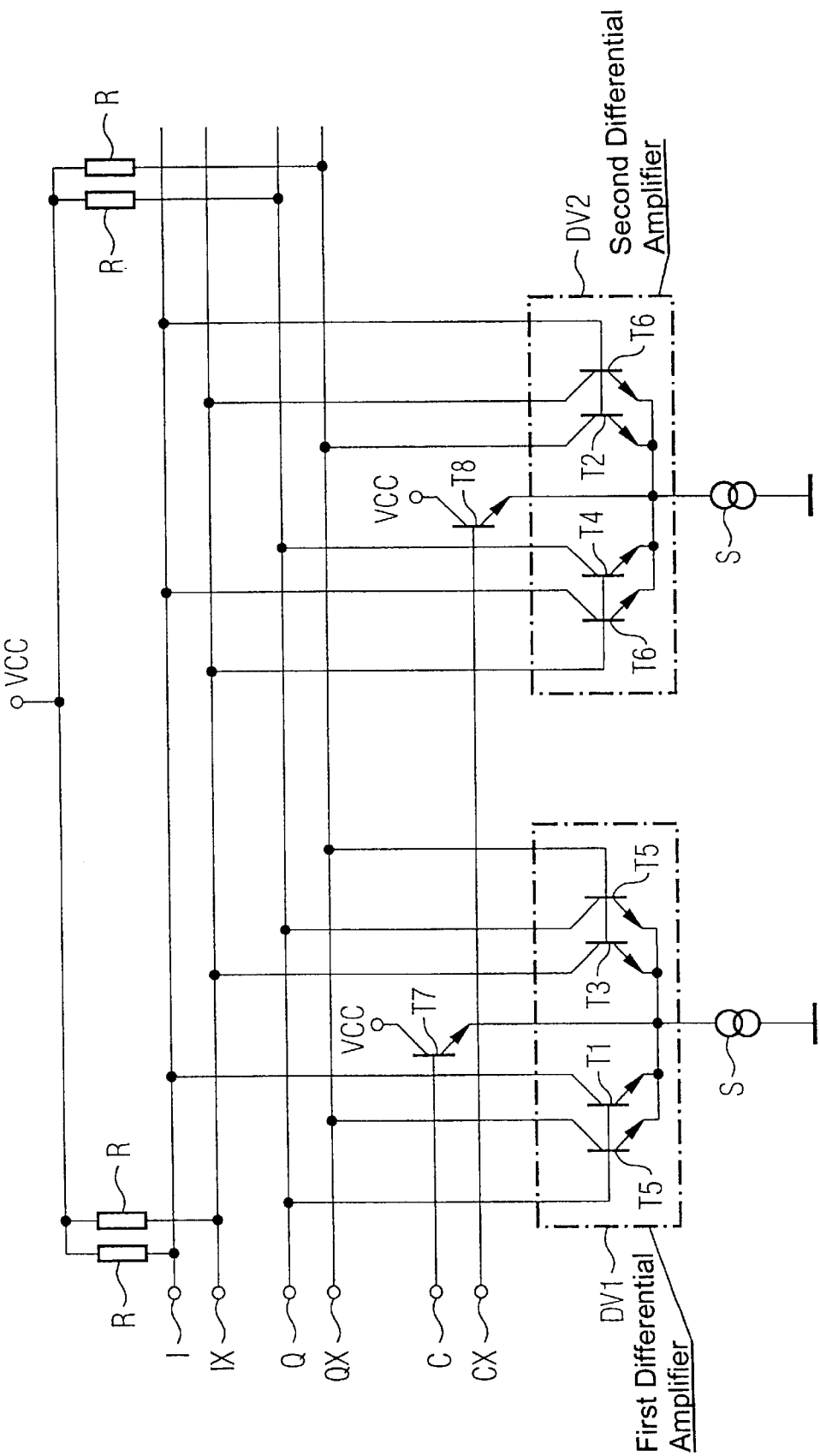
FIG. 2 a circuit diagram of a second exemplary embodiment of the frequency splitter circuit.

FIG. 2 represents a development of the frequency splitter circuit shown in FIG. 1 in which respective emitter followers T7, T8 are provided for switching the first and second differential amplifiers DV1, DV on and off, instead of the switchable current sources S1, S2 which are connected to the emitter nodes of the first and second differential amplifiers DV1, DV2 shown in FIG. 1. In FIG. 2, the emitter nodes are connected to current sources S, which are connected to a terminal for a reference potential. The emitter follower T7, which is constructed as a bipolar transistor, is connected at its base terminal to the clock signal input C, at its emitter terminal to the common emitter terminal of the first differential amplifier DV1, and at its collector terminal to the supply terminal VCC. Similarly, the emitter follower T8 is connected at its base terminal to the clock signal input CX, at its emitter terminal to the common emitter terminal of the second differential amplifier DV2, and at its collector terminal to the supply terminal VCC. Aside from this actuation of the first and second differential amplifiers DV1, DV2 with the aid of the clock input signal, the frequency splitter circuit according to FIG. 2 corresponds to that of FIG. 1.

The deactivation signal of the respective inactive differential amplifier stage DV1, DV2 with the emitter followers T7, T8 is accomplished by raising the potential of the common emitter node to the potential at the supply terminal VCC. This way, the differential amplifiers DV1, DV2 can be switched off more rapidly than with switchable current sources as represented in FIG. 1, so that large edge steepnesses in the clock output signals can be achieved. In addition, it is possible to operate the described frequency splitter circuit with particularly low supply voltage and particularly large signal amplitudes at the outputs I, IX, Q, QX, which are constructed for differential signals.

Figure 3:
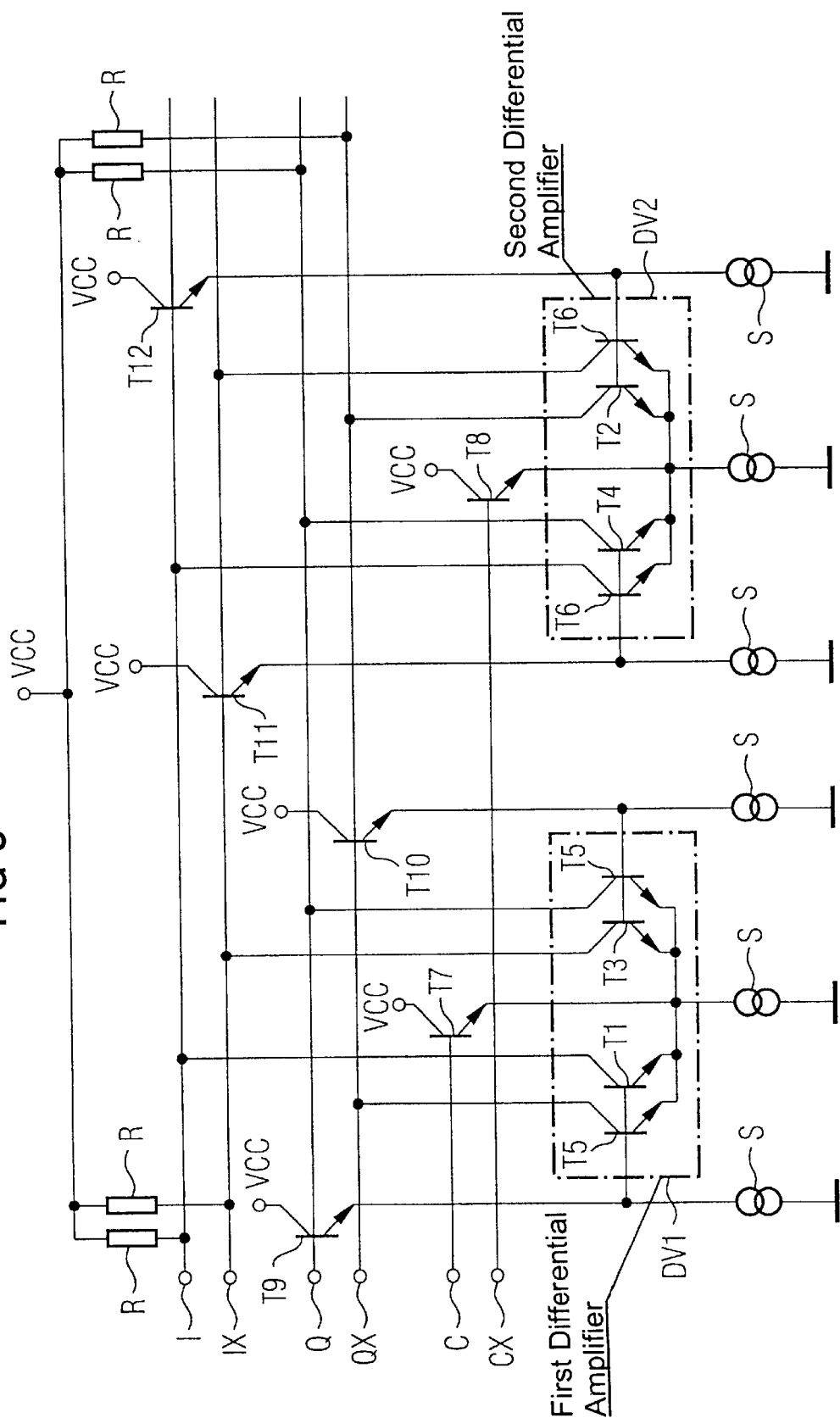
FIG. 3 a circuit diagram of a third exemplary embodiment of the frequency splitter circuit.

FIG. 3 represents a third exemplary embodiment of the frequency splitter circuit, which corresponds to a development of the frequency splitter circuit shown in FIG. 2. Here, the coupling of the base terminals of the transistors T1, T2, T3, T4, T5, T6 of the first and second differential amplifiers DV1, DV2 with the auxiliary and main outputs Q, QX, I, IX is improved by providing emitter followers T9, T10, T11, T12 for supplying signals to the differential amplifiers DV1, DV2 on the input side. The base terminals of the emitter followers T9, T10, T11, T12 are respectively connected to the corresponding main and auxiliary outputs Q, QX, I, IX, whereas the emitter terminals of the emitter followers T9 to T12 are connected to respective base terminals of the transistors T1 to T6 of the differential amplifiers DV1, DV2, which are connected to the reference potential by way of respective current sources S.

The frequency splitter circuit according to FIG. 3 with the additional emitter followers T9 to T12 makes possible still larger signal amplitudes at the main and auxiliary outputs I, IX, Q, QX, since the emitter followers T9 to T12 can provide higher currents to the differential amplifiers DV1, DV2 on the input side. The higher edge steepness in the frequency splitter circuit according to FIG. 3 leads to a particularly small phase noise of the frequency splitter.

In alternative embodiments of the frequency splitter circuit, pnp transistors or field effect transistors can be utilized instead of the above described npn transistors. Of course, source followers must then be provided instead of the above described emitter followers.

The above described frequency splitter circuits can be realized with only two differential amplifiers and therefore have a low current consumption. The current sources S and the switchable current sources S1, S2 which are provided on the reference potential side and the ground side, respectively, make it possible to operate the frequency splitter circuit substantially independently of supply voltage oscillations.

Figure 4:
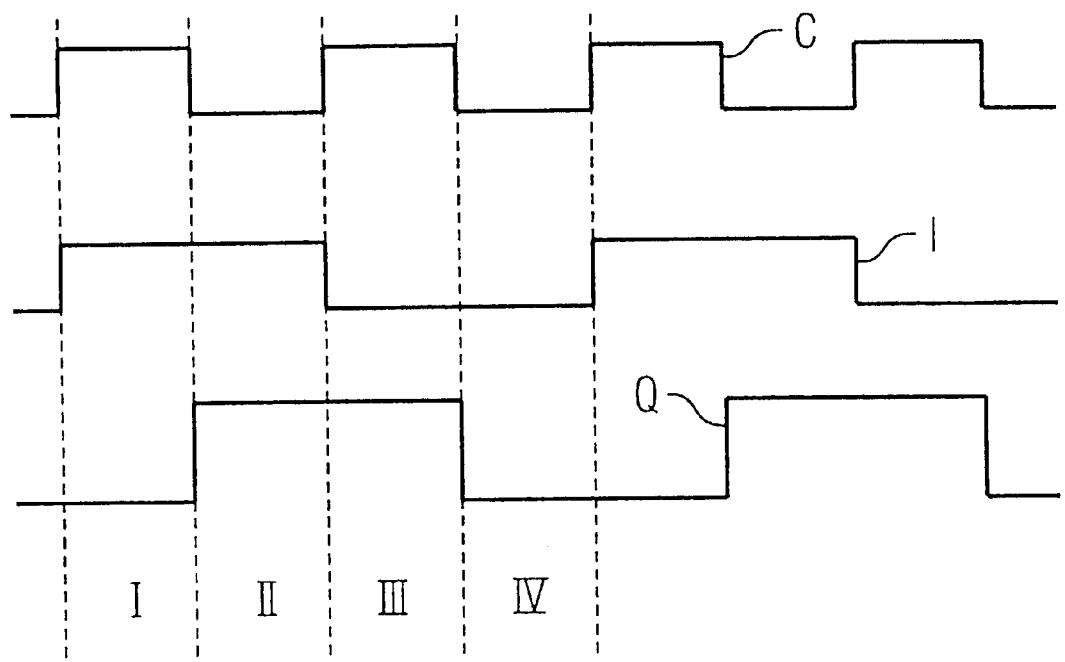
FIG. 4 a status diagram of the clock input and clock output signals according to the frequency splitter circuits of FIGS. 1 to 3.

Lastly, FIG. 4 represents the function of the frequency splitter circuits according to FIGS. 1 to 3 with reference to the characteristic curves of the signals at the clock signal input C and at the main and auxiliary outputs I, Q. Four clock phases I, II, III, IV are represented, which occur in periodic succession. It is evident that the signal supplied at the clock signal input C has double the frequency of the signals that are derivable at the main and auxiliary outputs I, Q. The signals, which are derivable at the main and auxiliary outputs I, Q are phase-shifted 90° relative to one another. The signal, which is derivable at the main output I, IX is in phase with the clock input signal, while the signal that is derivable at the auxiliary output Q, QX is phase-shifted 90°. During the first and third clock phases I, III, the first differential amplifier DV1, which is actuated by the non-inverted clock signal C, is active. During the second and fourth clock phases II, IV, the second differential amplifier DV2, which is actuated by the inverted clock signal CX (which is not included in the illustration), is active. The first differential amplifier DV1 forms the inverse signal of the signal pending at the auxiliary output Q on the output side, i.e. at the main output I. The second differential amplifier DV2 forms the non-inverted signal of the signal pending at the main output I on the output side, i.e. at auxiliary output Q.

I claim:

1. A frequency divider circuit, comprising:
   a clock input for receiving a clock input signal having a frequency;
   a main output providing a clock output signal having a frequency divided relative to the frequency of the clock input signal;
   an auxiliary output providing a clock output signal having a frequency divided relative to the frequency of the clock input signal;
   a first differential amplifier having an input coupled to said auxiliary output and having an output coupled to said main output; and
   a second differential amplifier having an input coupled to said main output and having an output coupled to said auxiliary output;
   said first differential amplifier and said second differential amplifier coupled with said clock input;
   a first emitter follower to be switched by the clock input signal and connected to said first differential amplifier; and
   a second emitter follower to be switched by the clock input signal and connected to said second differential amplifier.

2. The frequency divider circuit according to claim 1, wherein:
   said first differential amplifier iB coupled to said main output and said auxiliary output to provide an inverted signal; and
   said second differential amplifier is coupled to said main output and said auxiliary output to provide a non-inverted signal.

3. The frequency divider circuit according to claim 2, wherein:
   said first differential amplifier includes a device for holding a signal on said input of said first differential amplifier; and
   said second differential amplifier includes a device for holding a signal on said input of said second differential amplifier.

4. The frequency divider circuit according to claim 1, wherein:
   said first differential amplifier includes a device for holding a signal on said input of said first differential amplifier; and
   said second differential amplifier includes a device for holding a signal on said input of said second differential amplifier.

5. The frequency divider circuit according to claim 1, further comprising:
   a first emitter follower group coupling said input of said first differential amplifier to said auxiliary output; and
   a second emitter follower group coupling said input of said second differential amplifier to said main output.

6. The frequency divider circuit according to claim 1, wherein:
   said first differential amplifier includes four emitter-coupled npn transistors having emitter terminals coupled with said clock input; and
   said second differential amplifier includes four emitter-coupled npn transistors having emitter terminals coupled with said clock input.

7. The frequency divider circuit according to claim 6, wherein:
   the clock input signal is supplied to said emitter terminals of said transistors of said first differential amplifier in a non-inverted form; and
   the clock input signal is supplied to said emitter terminals of said transistors of said second differential amplifier in an inverted form.

* * * * *